United States Patent [19]

Takahashi et al.

[11] Patent Number: 5,532,070
[45] Date of Patent: Jul. 2, 1996

[54] SOLDER-PRECOATED CONDUCTOR CIRCUIT SUBSTRATE AND METHOD OF PRODUCING THE SAME

[75] Inventors: Shinji Takahashi, Ogaki; Toshihisa Tuchiya, Ibi-gun, both of Japan

[73] Assignee: Ibiden Co., Ltd., Ogaki, Japan

[21] Appl. No.: 338,531
[22] PCT Filed: Jun. 1, 1993
[86] PCT No.: PCT/JP93/00736
  § 371 Date: Dec. 30, 1994
  § 102(e) Date: Dec. 30, 1994
[87] PCT Pub. No.: WO93/25060
  PCT Pub. Date: Dec. 9, 1993

[30] Foreign Application Priority Data

Jun. 2, 1992 [JP] Japan .................................. 4-165479
Feb. 22, 1993 [JP] Japan .................................. 5-032085

[51] Int. Cl.$^6$ ........................................... B32B 9/00
[52] U.S. Cl. .................... 428/643; 428/644; 428/209; 428/901
[58] Field of Search ............................. 428/209, 901, 428/643, 644

[56] References Cited

U.S. PATENT DOCUMENTS 3,658,488  4/1972  Brown et al. .................... 428/463
4,269,625  5/1981  Molenaar ........................ 106/1.22

FOREIGN PATENT DOCUMENTS 59-035694  2/1984  Japan .
61-217582  9/1986  Japan .
 62-9670   3/1987  Japan .
63-169389  7/1988  Japan .
01011980  1/1989  Japan .
 1-37876   8/1989  Japan .
 2-101190  4/1990  Japan .
 4-21795   1/1992  Japan .

OTHER PUBLICATIONS

Supplemental European Search Report.
Patent Abstracts of Japan, vol. 8, No. 122 (C–227), Jun. 8, 1994.
Patent Abstracts of Japan, vol. 13, No. 187 (C–592), May 2, 1989.
IBM Research and Development, vol. 28, No. 6, Nov. 1984, New York, New York, pp. 726–734, Z. Kovac et al.
English Language Abstract of JP-61-217582.
Abridged English Translation of JP-63-169389.
Abridged English Translation of JP-1-37876.
Abridged English Translation of JP-62-9670.
English Language Abstract of JP-2-101190.
English Language Abstract of JP-4-21795.
Surface Technology, 16(1982) 265–275.
International Search Report.

*Primary Examiner*—Patrick J. Ryan
*Assistant Examiner*—Kam F. Lee
*Attorney, Agent, or Firm*—Greenblum & Bernstein

[57] ABSTRACT

It is to establish a solder precoated conductor circuit substrate capable of conducting the fine pitch mounting and being excellent in the productivity and a technique of producing the same. In the solder precoated conductor circuit substrate, the solder layer formed on the conductor for the connection of electronic component is constituted with Sn thin film layer formed by Cu-Sn substitution reaction based on, for example, the Cu complex formation of thiourea and a Pb-coated Sn layer formed by covering at least a part of Sn crystal grains formed through Sn unhomogeneous reaction based on selective precipitation on Sn with Pb through Sn-Pb substitution reaction based on ionization tendency, in which the solder layer is desirably heated and melted and thereafter cooled to form an alloy layer.

13 Claims, 2 Drawing Sheets

FIG_1a 
FIG_1b 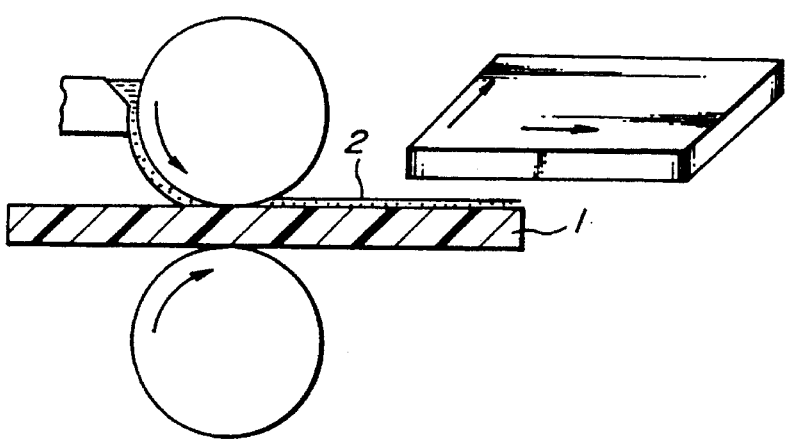
FIG_1c 
FIG_1d 
FIG_1e 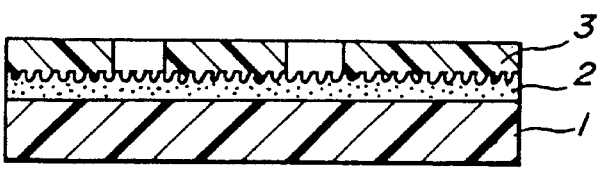
FIG_1f 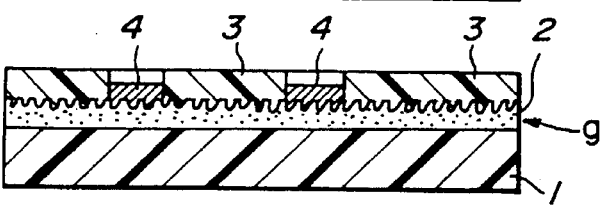
FIG_1g 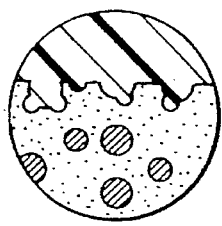

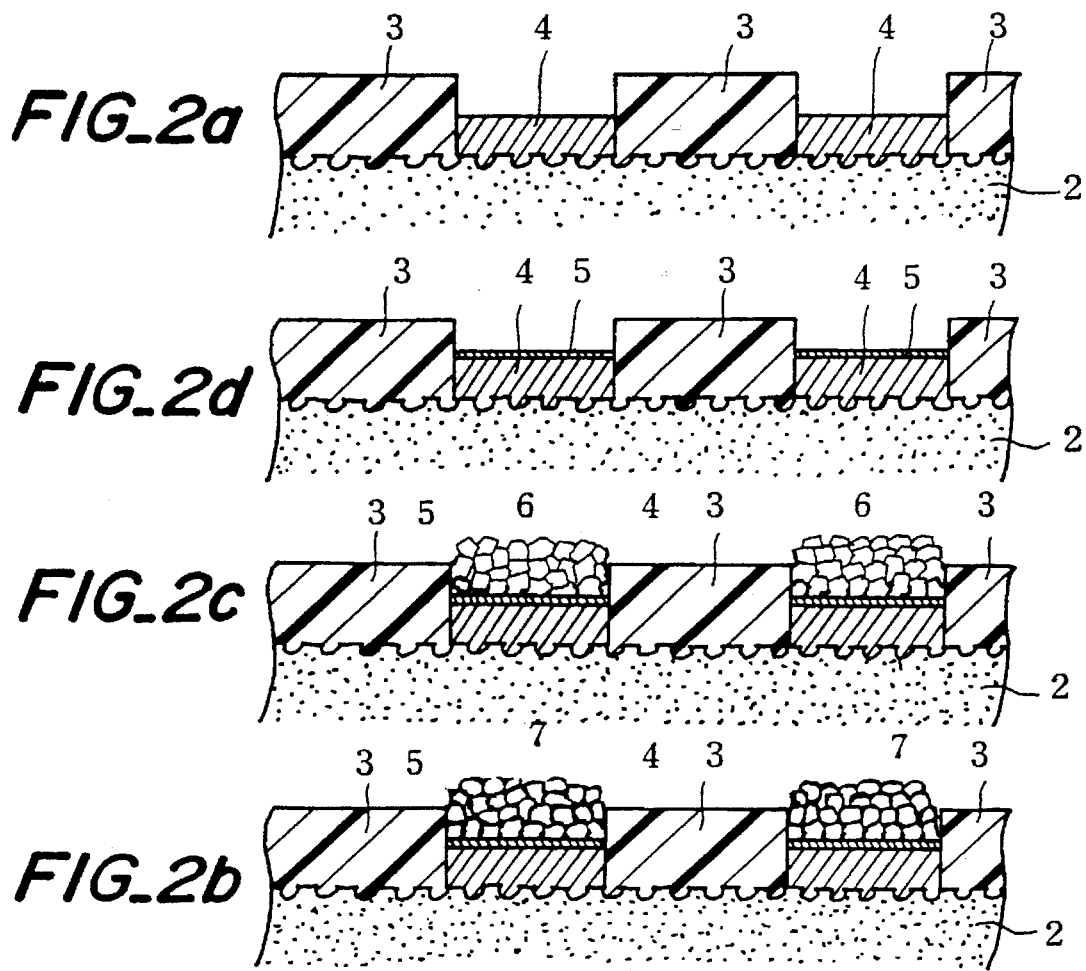

SOLDER-PRECOATED CONDUCTOR CIRCUIT SUBSTRATE AND METHOD OF PRODUCING THE SAME

BACKGROUND OF THE INVENTION

1. Technical Field

This invention relates to a solder-precoated conductor circuit substrate and a method of producing the same, and more particularly to a solder-precoated conductor circuit substrate capable of mounting components in a high packaging density and having an excellent productivity and a method of producing the same.

2. Background Art

Recently, conductor circuit substrates for mounting electronic components such as IC, LSI and the like are demanded to have a fine pattern with the miniaturization and high densification of these electronic components. For this purpose, more precision is required even in the connection of surface mounting components to the conductor circuit substrates.

As a technique of connecting the surface mounting component to the conductor circuit substrate, there is widely used a soldering method, particularly a reflow soldering method with a high productivity. This method is a technique in which a solder paste is previously supplied onto a copper foil (pad) located on a surface of a printed circuit substrate and a surface mounting component is positioned and mounted thereon and thereafter the resulting assembly is placed in a heating furnace (fellow furnace) to melt the solder for the connection.

(a) In this technique, a molten solder plating method, a solder paste printing method, an electrolytic solder plating method, an electroless solder plating method and the like are adopted as a method for supplying a solder for surface mounting onto the pad of the conductor circuit substrate.

However, these solder supplying methods have the following problems for conducting the surface mounting of fine pitch.

(1) In the molten solder plating method, it is difficult to control the plating thickness and a uniform plated film is not obtained.

(2) In the solder paste printing method, the limit of pitch width capable of supplying the solder is 0.3 mm and the narrowing of the pitch can not be conducted.

(3) In the electrolytic solder plating method, a lead for voltage application is required and hence the steps become complicated and the degradation of pattern wiring density results.

(4) In the electroless solder plating method, the formation of plated film is a substitute on reaction with copper and it is difficult to increase the thickness of the film.

Furthermore, there is a method in which Sn film and Pb film formed on the pad of the conductor circuit substrate through plating is alloyed to feed a solder for surface mounting as the other method of supplying the solder (JP-A-2-101190 and JP-A-4-21795). According to this method, the solder having a desired alloying ratio can easily and surely be provided on the pad of the conductor circuit substrate.

However, the latter solder-supplying method has the following problems in order to conduct the surface mounting of fine pitch:

(1) When Sn film and Pb film are formed by electrolytic plating, a lead for voltage application is required and hence the steps become complicated and the degradation of pattern wiring density results.

(2) When Sn film is formed by electroless plating, it is difficult to increase the film thickness.

(3) Since Sn film and Pb film are formed in the form of individual layers, it is difficult to conduct complete alloying in the reflow soldering.

(b) On the contrary, a super-solder technique and a self-solder QFP technique are recently proposed as a soldering technique in the surface mounting. That is, the super-solder technique is a solder producing technique in which an alloy obtained by heating reaction between Pb and Sn of organic acids is selectively precipitated onto the pad of the conductor circuit substrate. On the other hand, the self-solder QFP technique is a technique in which outer lead (pin) portions of the surface mounting component is previously subjected to a high-speed electrolytic solder plating and mounted onto the conductor circuit substrate. Certainly, it is possible to conduct the surface mounting of fine pitch onto the conductor circuit substrate according to these techniques.

However, all of these conventional techniques have a problem that the productivity is poor. That is, the super-solder technique is high in the production cost, and contains a great amount of a soldering ingredient in the reaction residue, and leaves impurities (Pb, Sn salts of organic acid) onto the plated resist to degrade the insulating property of the resist, so that there is a problem in a point that a recovery device for solid matter is required as a washing machine for production line. On the other hand, the self-solder QFP technique has a production problem in a point that the individual mounting components are required to be subjected to a plating.

As mentioned above, the conventional techniques for coping with the surface mounting of fine pitch accompanied with the rapidly progressing miniaturization of conductor circuit substrates, high-density wiring, miniaturization of surface mounting components and the like are insufficient in the thickness of the soldered layer and hardly provide the necessary electrical insulating property and are lacking in the reliability of the mounting conductor circuit substrate.

SUMMARY OF THE INVENTION

It is an object of the invention to solve the aforementioned problems of the conventional techniques and to provide a technique on a solder-precoated conductor circuit substrate capable of conducting fine pitch mounting and having excellent productivity.

The inventors have made various studies in order to realize the above object. As a result, it has been found that a metal layer for the connection of electronic components having a desired thickness and Sn/Pb ratio after the melting can be formed by electroless plating when using an unhomogeneous reaction of Sn under a high alkali without a reducing agent (See Surface Technology, 16(1982) 265–275, U.S. Pat. No. 4,269,625) and a substitution reaction between Cu and Sn or Sn and Pb with ionization tendency, and the invention has been accomplished.

That is, the invention lies in a solder-precoated conductor circuit substrate formed by previously disposing a solder layer required for mounting onto conductors for the connection of an electronic component, characterized in that the solder layer is made from an Sn thin film layer and a Pb-coated Sn layer in which at least a part of Sn crystal grains is coated with Pb film.

In a preferable embodiment of the solder-precoated conductor circuit substrate, the metal layer formed by the Sn thin film layer and the Pb-coated Sn layer, in which at least a part of Sn crystal grains is coated with Pb film, is melted by heating to form an alloy layer.

Furthermore, the method of producing the solder-precoated conductor circuit substrate formed by previously disposing a solder layer required for mounting onto conductors for the connection of an electronic component according to the invention is characterized in that the solder layer is formed through the following steps (a)–(c):

(a) a step of forming an Sn thin film layer onto conductors of a conductor circuit substrate formed for the connection of the electronic component;

(b) a step of selectively precipitating Sn on the Sn thin film layer through Sn unhomogeneous reaction to form an Sn crystal layer; and (c) a step of coating at least a part of Sn crystal grains in the Sn crystal layer with Pb film through Sn-Pb substitution reaction based on ionization tendency to form a Pb-coated Sn layer.

Moreover, the solder layer is formed through the following steps (a)–(d):

(a) a step of forming an Sn thin film layer onto conductors of a conductor circuit substrate formed for the connection of the electronic component;

(b) a step of selectively precipitating Sn on the Sn thin film layer through Sn unhomogeneous reaction to form an Sn crystal layer;

(c) a step of coating at least a part of Sn crystal grains in the Sn crystal layer with Pb film through Sn-Pb substitution reaction based on ionization tendency to form a Pb-coated Sn layer; and (d) a step of melting the Sn thin film layer and the Pb-coated Sn layer in which at least a part of Sn crystal grains is coated with Pb film through heating and then cooling to form an alloy layer.

BRIEF DESCRIPTION OF THE DRAWINGS

FIGS. 1a–1f are representations of process steps for producing an embodiment of the printed circuit substrate used in the invention, and FIG. 2 is a flow chart illustrating an embodiment of solder supply in the method according to the invention. FIG. 1g is an enlarged view of portion g of FIG. 1f. In these figures, numeral 1 is a substrate, numeral 2 an adhesive layer (insulating layer), numeral 3 a resist, numeral 4 a Cu pad, numeral 5 an Sn thin film layer, numeral 6 an Sn crystal layer, and numeral 7 a Pb film.

DETAILED DESCRIPTION OF THE INVENTION

The solder-precoated conductor circuit substrate according to the invention will be described in detail below.

The invention is not a technique using the conventional electroless eutectic solder plating solution. In other words, the invention is a technique that the metal layer forming a desired solder alloy layer through melting is previously arranged on conductors for the connection of the electronic component by separately using Sn electroless plating solution and Pb electroless plating solution.

Particularly, the invention is characterized in a point of utilizing Sn unhomogeneous reaction as an electroless plating technique of Sn crystal and a point of forming the metal layer with an Sn thin film layer and a Pb-coated Sn layer in which at least a part of Sn crystal grains is coated with Pb film.

According to the above construction, the shortage of precipitated film thickness being a drawback in the substitution-type electroless eutectic solder plating can be solved, and also the drawback of incomplete alloying when using the Sn-Pb film of simple two-layer structure can be solved. As a result, it is possible to reliably conduct not only the mounting with a pitch width of 0.3 mm, which is difficult in the conventional technique, but also the narrower pitch mounting.

The metal layer for the connection of the electronic component consists of the Sn thin film layer and the Pb-coated Sn layer and is desired to have a composition ratio after melting of 99.9/0.1–80.0/20.0 as Sn/Pb ratio. Because, when Sn content exceeds 99.9%, a very high temperature is required in the melting and hence the damage is caused in the conductor circuit substrate, while when Pb content exceeds 20.0%, the solder after the melting is apt to be oxidized.

According to the invention, subtractive substrate, additive substrate and the like can be used as the conductor circuit substrate supplying the solder. Even when using either of the substrates, high-density mounting of fine pitch is possible as compared with the conventional technique.

Among them, the additive substrate has a permanent resist inherent thereto and can utilize a self-alignment effect based on the permanent resist, so that the positioning in the assembling of the surface mounting component becomes easy and also it is advantageously possible to prevent the formation of solder bridge by the solder dam effect in the solder reflow after the mounting of the component. Therefore, the solder-precoated conductor circuit substrate according to the invention using the additive substrate is favorable for mounting more fine pitched electronic components.

Then, the invention is described with reference to the method of producing the solder-precoated conductor circuit substrate.

(1) In the production of the solder-precoated conductor circuit substrate according to the invention, a given printed circuit substrate is first obtained by additive method, subtractive method or the like.

As the substrate used in the above circuit substrate, mention may be made of plastic substrate, ceramic substrate, metal substrate, film substrate and the like. For example, there are included glass-epoxy substrate, glass-polyimide substrate, alumina substrate, low-temperature fired ceramic substrate, aluminum nitride substrate, aluminum substrate, iron substrate, polyimide film substrate and so on. These substrates are used to prepare one-side circuit substrate, bothsides through-hole circuit substrate and multi-layer circuit substrate such as Cu/polyimide multi-layer circuit substrate or the like.

As the method of forming the conductor circuit in the above circuit substrate, electroless and electrolytic platings of copper, nickel, gold, silver and the like, sputtering of chromium, molybdenum or the like, paste printing of copper, silver, palladium, tungusten or the like are applicable, among which it is preferable to use electroless and electrolytic platings of copper.

In the production method according to the invention, a layer of different metal can be supplied onto the conductor circuit formed by the above various methods.

Moreover, in the method according to the invention, the above conductor circuit is formed by using various methods practised in known printed circuit substrates. For example, there are a method of subjecting the substrate to an electroless plating and etching a circuit, a method of directly forming a circuit in the electroless plating and the like.

(2) Then, Sn thin film layer is formed on the conductor for the connection of the electronic component on the conductor circuit substrate provided with the above formed conductor circuit by Cu-Sn substitution reaction desirably based on formation of Cu complex of thiourea. This step is necessary before a step of Sn unhomogenous reaction plating because the Sn unhomogenous reaction as mentioned later does not occur on the Cu surface but occurs only on Sn.

The thickness of the thin film is desired to be 0.1–2 μm, preferably 0.3–0.5 μm. When it is less than 0.1 μm, the Sn unhomogeneous reaction does not occur, while when it exceeds 2 μm, it is difficult to form the film.

The reason why thiourea is added in this step is due to the fact that, for example, if thiourea is not existent in Cu pad, standard electrode potential of Cu is higher than standard electrode potential of Sn, so that substitution precipitation of Sn is not caused on Cu pad. In this point, if S (thiourea: $SN(NH_2)_2$) is existent, Cu forms a thio-complex to shift the standard electrode potential to a value lower than that of Sn and hence the substitution precipitation of Sn can be conducted.

Moreover, the metal forming the conductor may include Ni, Au, Ag, Cr, W, Mo and the like in addition to Cu. In this case, the standard electrode potential of the conductor circuit metal is required to be lower than that of Sn.

(3) Then, Sn crystal layer is formed on the Sn thin film layer formed on the conductor of the circuit substrate for the connection of the electronic component by electroless plating through unhomogeneous reaction of Sn based on selective precipitation on Sn.

The electroless plating through unhomogeneous reaction of Sn is a self-catalyst type electroless plating caused by unhomogeneous reaction of stannous acid ion from an alkali solution containing no reducing agent:

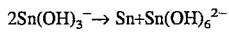

$$2Sn(OH)_3^- \rightarrow Sn+Sn(OH)_6^{2-}$$

The thus obtained Sn crystal layer is at a state of aggregating crystal grains owing to coarse precipitated crystals and becomes porous. When at least a part of Sn crystal grains in the porous crystal layer is subjected to a substitution reaction with Pb, the resulting Pb-coated Sn layer is easy to form a complete alloy layer at a lower temperature as compared with the simple Sn-Pb two layer structure according to the conventional technique.

The Sn crystal grains are desirable to have an average particle size of 1–100 μm, preferably about 50 μm for coping with the formation of fine pattern. When the average particle size of the Sn crystal grains is less than 1 μm, it is necessary to make the precipitation rate of Sn crystal slow and hence the plating time becomes longer for obtaining Sn layer, having a desired thickness and the resist for plating is not durable in the plating bath having a high alkali concentration at high temperature. On the other hand, when the average particle size of the Sn crystal grains exceeds 100 μm, the surface area of Sn crystal grains to be substituted with Pb becomes smaller.

The precipitation rate of Sn crystal grains is desirable to be 1–50 μm/hr as a conversion by thickness after the melting. When the precipitation rate is less than 1 μm/hr, the plating resist is not durable in the high-alkali plating bath at high temperature, while when the precipitation rate exceeds 50 μm/hr, the average particle size of Sn crystal grains becomes larger and the surface area to be substituted with Pb becomes smaller.

In this case, metal salts of Sn (II) are sufficient as a supply source of Sn, which preferably include chlorides ($SnCl_2 \cdot 2H_2O$), acetate ($Sn(CH_3COO)_2$), borofluoride ($Sn(BF_4)_2$) and sulfate ($SnSO_4$).

Moreover, it is difficult to obtain Sn film having a thickness of not less than 20 μm by the conventional electroless plating. In this connection, Sn film having a thickness of not less than 20 μm can easily be obtained by the aforementioned electroless plating using the unhomogeneous reaction.

(4) At least a part of Sn crystal grains in the Sn crystal layer formed by the unhomogeneous reaction of Sn is replaced with Pb by Sn-Pb substitution reaction based on ionization tendency to form Pb film, whereby a solder-precoated conductor circuit substrate provided with a metal layer forming the solder layer on the conductor for the connection of the electronic component is produced.

The Pb-coated Sn layer obtained by substituting a part of Sn crystal layer with Pb through the unhomogeneous reaction is a structure of covering the surface of Sn crystal grain with Pb film because the layer structure of Sn crystal layer is an aggregate of Sn crystal grains.

The Sn-Pb substitution reaction based on the ionization reaction is desirably conducted at a temperature of from room temperature to 90° C., preferably about 50° C. When the temperature is lower than room temperature, the reaction rate becomes slow, while when it exceeds 90° C., the reaction rate is too fast and it is difficult to control the composition of Sn/Pb.

The Pb film formed by replacing at least a part of Sn crystal grains through Sn-Pb substitution reaction based on the ionization tendency is desirable to have a thickness of 0.1–5 μm, preferably 0.3–3 μm. When the thickness of Pb film is less than 0.1 μm, the solder alloy layer can not be formed from the Sn thin film layer and the Pb-coated Sn layer, while when the thickness of Pb film exceeds 5 μm, Pb surface is oxidized.

In this case, metal salts of Pb(II) are sufficient as a supply source of Pb, which preferably include chloride ($PbCl_2$), acetate ($Pb(CH_3COO)_2 \cdot 2H_2O$), borofluoride ($Pb(BF_4)_2$) and nitrate ($Pb(NO_3)_2$).

(5) Preferably, the thus produced solder-precoated conductor circuit substrate according to the invention is placed in a heating furnace (reflow furnace) and heated to melt the metal layer, whereby the alloyed solder-precoated conductor circuit substrate is formed.

According to the thus produced solder-precoated conductor circuit substrate, solder is melted and resolidified by the heat press of the connection portion of the electronic component onto the obtained solder layer and the like, whereby the electronic component can be mounted on the substrate with a high reliability.

Moreover, the mounting of such an electronic component may be carried out by previously mounting the electronic compartment onto the alloy layer without alloying the metal layer in the heating furnace (reflow furnace) and thereafter melting and alloying the metal layer in the heating furnace (fellow furnace).

EXAMPLE 1

(1) Preparation of additive type printed conductor circuit substrate (a) 1275 parts by weight of melamine resin is mixed with 1366 parts by weight of 37% formalin and 730 parts by weight of water, adjusted to pH=9.0 with 10% sodium carbonate, held at 90° for 60 minutes and added with 109 parts by weight of methanol to obtain a resin solution.

(b) The resin solution is dried by a spray drying method to obtain powdery resin.

(c) The resin powder obtained in the item (b), a releasing agent and a curing catalyst are pulverized and mixed in a ball mill to obtain a mixed powder.

(d) The mixed powder is placed in a mold heated at 150° C. and held under a pressure of 250 kg/cm² for 60 minutes to obtain a molded product. In the molding, the mold is vented.

(e) The molded product obtained in the item (d) is finely pulverized in a ball mill to obtain powders having a particle size of 0.5 μ m or 5.5 μ m.

(f) 60 parts by weight of phenol-novolac type epoxy resin (made by Yuka Shell K.K.), 40 parts by weight of bisphenol A-type epoxy resin (made by Yuka Shell K.K.) and 5 parts by weight of an imidazole curing agent (made by Shikoku Kasei K.K.) are dissolved into butylcellosolve acetate and mixed with 15 parts by weight of the fine powder having a particle size of 0.5 μm and 30 parts by weight of the fine powder having a particle size of 5.5 μ m in the above item (5) based on 100 parts by weight of solid content in the composition and then kneaded in three rolls and added with butylcellosolve acetate to prepare an adhesive solution having a solid content concentration of 75%. The viscosity of this solution is 5.2 Pa.s at a revolution number of 6 rpm and 2.6 Pa.s at 60 rpm as measured at 20° for 60 seconds by means of a digital viscosity meter made by Tokyo Keiki K.K. according to JIS-K 7117, and an SVI value thereof (thixotropic property) is 2.0.

(g) A glass-epoxy substrate 1 (see FIG. 1a) is toughened by polishing to have a roughness of JIS-B0621 Rmax=2–3 μm and then-the adhesive solution prepared in the item (f) is applied onto the substrate by using a roll coater (see FIG. 1b). As a coating roll in this application method, a coating roll for middle-high viscosity resist (made by Dainippon Screen K.K.) is used, in which a gap between the coating roll and a doctor bar is 0.4 mm, a gap between the coating roll and a back-up roll is 1.4 mm and a transfer velocity is 400 mm/s. After being left to stand at a horizontal state for 20 minutes, the drying is carried out at 70° C. to form an adhesive layer 2 having a thickness of about 50 μ m (see FIG. 1c).

(h) The substrate provided with the adhesive layer 2 (see FIG. 1c) is immersed in an oxidizing agent consisting of an aqueous solution of 500 g/l of chromic acid ($CrO_3$) at 70° C. for 15 minutes to roughen the surface of the adhesive layer 2, which is immersed in a neutral solution (made by Shiplay Inc.) and washed with water. A palladium catalyst (made by Shiplay Inc.) is applied onto the toughened adhesive layer 2 of the substrate to activate the surface of the adhesive layer 2 (see FIG. 1d).

(i) The substrate treated in the above item (h) is subjected to a heat treatment for fixation of the catalyst at 120° C. in an atmosphere of nitrogen gas (10 ppm) for 30 minutes.

(j) Onto the substrate treated in the item (i) is applied a resin solution obtained by applying a photosensitivity to the adhesive solution of the item (f) through the roll coater likewise the item (g). In order to remove the solvent in the resulting applied layer, the heat treatment is carried out at 80° C. for 30 minutes, and then exposed to a light through a mask for the formation of a pattern, which is developed with an Eterna IR (made by Asahi Chemical Industry Co., Ltd.), irradiated by ultraviolet ray (UV cure) and subjected to a heat treatment to form a plating resist 3 (thickness: 40 μ m) (see FIG. 1e).

(k) The substrate provided with the plating resist 3 of the item (j) is immersed in an electroless copper plating solution having a composition under conditions as shown in Table 1 for 11 hours to form an electroless copper plated film of 25 μ m in thickness for the formation of conductor portion, whereby an additive type printed conductor circuit substrate provided with Cu pad for mounting an electronic component (0.15 mm TAB, 0.3.0.5 mm QFP) having various lead pitches (0.15, 0.3, 0.5 mm) (see FIG. 1f). In this case, a step difference between the resist 3 and the Cu pad 4 of the plated film is 15 μm.

TABLE 1

| Composition and conditions of electroless copper plating solution | |
|---|---|
| Copper sulfate | 0.06 mol/l |
| Formalin (37%) | 0.30 ml/l |
| Sodium hydroxide | 0.35 mol/l |
| EDTA | 0.35 mol/l |
| Additive | little |
| Temperature | 70–72° C. |
| pH | 12.4 |

(2) Pretreatment

Then, the printed conductor circuit substrate having the electroless copper plated Cu pad 4 for the mounting of the electronic component (see FIG. 2a) is treated with a degreasing solution (Alkykate, made by Shiplay Inc.) at 70° C. for 5 minutes, washed with water, treated with an activating solution (usually soft etch) at room temperature for 10 seconds to form a solder feeding plated substrate.

(3) Formation of Sn thin film layer 5 (see FIG. 2b)

The substrate obtained in the item (2) is immersed in an electroless Sn-substituted plating solution having a composition and conditions adjusted by dissolving thiourea and solution of tin borofluoride ($Sn(BF_4)_2$) in water as shown in Table 1 for about 1 minute to substitute Cu surface with Sn layer, whereby an electroless Sn substituted plated film of 0.3–0.5 μ m in thickness is formed.

TABLE 2

| Composition and conditions of electroless Sn substitution plating solution | |
|---|---|
| Tin borofluoride | 0.1 mol/l |
| Thiourea | 1.0 mol/l |
| Temperature | 80° C. |
| pH | 1.2 |

(4) Formation of Sn crystal layer 6 (see FIG. 2(c))

The substrate subjected to the plating treatment of the item (3) is washed with water and immersed in an electroless Sn thick plating solution (utilizing Sn unhomogeneous reaction) having a composition and conditions adjusted by adding a solution of tin chloride (titanous chloride dihydrate) in water to a solution of sodium hydroxide in water with stirring and finally adding formalin as a stabilizing agent as shown in Table 3 for 3 hours to form Sn crystal layer on the Sn thin film 5 formed in the item (3), whereby the electroless Sn thick plated film having a maximum thickness of 100–150 μ m is obtained. The obtained Sn thick crystal layer is an aggregate of crystal grains as a result of observation on surface and cut section. The size of the crystal grain is about 50 μ m on average. Furthermore, the precipitation rate of Sn crystal grain is 25 μ m/hr as a thickness conversion after the melting.

TABLE 3

Composition and conditions of electroless Sn thick plating solution

| | |
|---|---|
| Sodium hydroxide | 5.2 mol/l |
| Titanous chloride dihydrate | 0.4 mol/l |
| Formalin (37%) | 1.0 ml/l |
| Additive | little |
| Temperature | 80° C. |
| pH | 14–15 |

(5) Formation of Pb film 7 (see FIG. 2d)

The substrate subjected to the treatment of the item (4) is washed with water and immersed in an electroless Pb substitution plating solution having a composition and conditions adjusted by dissolving a solution of lead (II) tetrafluoroborate and hydroborofluoric acid into water as shown in FIG. 4 for 5 minutes to form an electroless Pb substituted plated film skinly replacing the surface of the Sn crystal grain in the Sn crystal layer 6 of the item (4) with Pb film (presumption 0.3–3 μ m).

TABLE 4

Composition and conditions of electroless Pb thick plating solution

| | |
|---|---|
| Lead (II) tetrafluoroborate | 0.1 mol/l |
| Hydroborofluoric acid | 1.0 mol/l |
| Temperature | 80° C. |
| pH | 3.5 |

(6) Post treatment

Then, the substrate treated in the item (5) is washed with water, dried in a hot air dryer at 80° C. for 10 minutes, an additive type solder precoated conductor circuit substrate in which metal (Sn, Pb) for mounting the electronic component is supplied onto the Cu pad 4 through plating is obtained (see FIG. 2).

Moreover, the composition of the connecting metal for mounting the electronic component is Sn/Pb ratio of 6/4 as a result of EDS analysis after the solder precoated conductor circuit substrate is heated to melt and alloy the metal (Sn, Pb) supplied through single plating.

(7) Mounting of electronic component

In case of 0.3, 0.5 mm QFP, the electronic component is placed on the given portion of the additive type solder precoated conductor circuit substrate without heating and then heated in a reflowing machine for the mounting, while in case of 0.15 mm TAB, the electronic component is placed on the given portion and heated by a hot bar (pulse heat system) for the mounting.

EXAMPLE 2

(1) The same procedure as shown in the steps of the items (1)–(6) of Example 1 is carried out to obtain an additive type solder precoated conductor circuit substrate in which metal for mounting the electronic component (solder after the melting: Sn/Pb ratio is 6/4) is supplied onto Cu pad through plating.

(2) Then, the circuit substrate is immersed in an organic hot medium at 210° C. for 5 seconds to melt and alloy Sn and Pb supplied on copper. In this case, the solder alloyed by melting (Sn/Pb ratio: 6/4) is rendered into an arc shape in which a resist wall portion having Cu lead width or same height is a cord.

(3) Then, the same procedure as in the step of the item (7) of Example 1 is carried out to mount various electronic components.

EXAMPLE 3

(1) The same procedure as shown in the steps of the items (1)–(6) of Example 1 is carried out except that the substrate is immersed in a Pb substitution plating solution for 2 minutes at the step of the item (5) of Example 1, whereby an additive type solder precoated conductor circuit substrate is obtained.

(2) The circuit substrate is subjected to a heating treatment to conduct the alloying (Sn/Pb ratio: 9/1) and then the same procedure as in the step of the item (7) of Example 1 is repeated to mount various electronic components.

EXAMPLE 4

(1) A copper-lined laminate (thickness of rolled copper foil 18 μ m) is treated by a usual etched boil process to obtain a subtractive type printed conductor circuit substrate provided with Cu pads for mounting an electronic component of various lead pitches (0.15, 0.3, 0.5 mm).

(2) Then, the same procedure as in the steps of the items (3)–(6) of Example 1 is repeated to obtain a subtractive type solder precoated conductor circuit substrate in which metal (solder) for mounting the electronic component is supplied onto copper and copper side wall.

(3) Then, the circuit substrate is immersed in an organic heat medium at 210° C. for 5 seconds to melt and alloy Sn and Pb supplied on copper and copper side wall. In this case, the solder alloyed by melting (Sn/Pb ratio: 6/4) has a shape enveloping the Cu pad.

(4) Then, the same procedure as in the step of the item (7) of Example 1 is repeated to mount various electronic components.

Comparative Example 1

(1) The same procedure as in the steps of the item (1) of Example 1 is repeated to obtain an additive type printed conductor circuit substrate provided with Cu conductor portions of various pad pitches.

(2) Then, a solder paste having a particle size of 20–38 μ m (made by Tamura Seisakusho) is printed on the circuit substrate at a squeeze rate of 2–3 cm/s through a metal mask by means of a solder printing machine (made by Yokota Seisakusho) to form a solder of 50 μ m (Sn/Pb ratio: 6/4). Moreover, the solder cannot be formed on Cu pad having a pitch of not more than 0.3 mm with a high accuracy. Further, the scattering of solder thickness is caused in accordance with the lead pitch.

(3) Then, the same procedure as in the step of the item (7) of Example 1 is repeated to mount various electronic components.

Comparative Example 2

(1) The same procedure as in the steps of the item (1) of Example 1 to obtain an additive type printed conductor circuit substrate provided with Cu conductor portions of various pad pitches. Moreover, leads for the supply of current are previously arranged on all pads.

(2) Then, the circuit substrate is subjected to an electrolytic solder plating in the usual manner to form a solder of 50 μm (Sn/Pb ratio: 6/4) on the Cu pad.

(3) Then, the same procedure as in the steps of the item (7) of Example 1 is repeated to mount various electronic components.

Comparative Example 3

(1) The same procedure as in the steps of the item (1) of Example 1 to obtain an additive type printed conductor circuit substrate provided with Cu conductor portions of various pad pitches.

(2) Then, the circuit substrate is pretreated and then subjected to an electroless solder plating (Cu substitution type) at room temperature. In this case, however, only the solder of 10–15 μm (Sn/Pb ratio: 6/4) is formed on the Cu pad. The thickness of the solder is a limit of the above value because the formation of the solder through plating utilizes the substitution reaction with Cu as a pad.

(3) Then, the same procedure as in the steps of the item (7) of Example 1 is repeated to mount various electronic components.

Comparative Example 4

(1) The same procedure as in the steps of the item (1) of Example 4 is repeated to obtain a subtractive type printed conductor circuit board provided with Cu conductor portion of various pad pitches.

(2) Then, the circuit substrate is subjected to the same treatment as in the step of the item (2) of Comparative Example 1, whereby the solder paste is printed on the substrate to form a solder on the Cu pads of various lead pitches. Similarly, the solder can not be formed on the Cu pad having a pitch of not more than 0.3 mm with a high accuracy and the scattering of solder thickness is caused.

(3) Then, the same procedure as in the steps of the item (7) of Example 1 is repeated to mount various electronic components.

Comparative Example 5

(1) The same procedure as in the steps of the item (1) of Example 4 is repeated to obtain a subtractive type printed conductor circuit board provided with Cu conductor portion of various pad pitches. Moreover, leads for the supply of current are previously arranged on all pads.

(2) Then, the circuit substrate is subjected to the same treatment as in the step of the item (2) of Comparative Example 2 to form a solder of 50 μm (Sn/Pb ratio: 6/4) on the Cu pad of the substrate through the electrolytic solder plating.

(3) Then, the same procedure as in the steps of the item (7) of Example 1 is repeated to mount various electronic components.

Comparative Example 6

(1) The same procedure as in the steps of the item (1) of Example 4 is repeated to obtain a subtractive type printed conductor circuit board provided with Cu conductor portion of various pad pitches.

(2) Then, the circuit substrate is subjected to the same treatment as in the step of the item (2) of Comparative Example 3 to form a solder of 10–15 μm (Sn/Pb ratio: 6/4) on the Cu pad of the substrate through the electroless solder plating.

(3) Then, the same procedure as in the steps of the item (7) of Example 1 is repeated to mount various electronic components.

After the solder is supplied onto the Cu pad by using various solder supplying methods (method according to the invention, solder paste printing method, electrolytic solder plating method and electroless substitution solder plating method) alone to form the solder precoated conductor circuit substrate as mentioned above and then electronic components having various lead pitches (0.15TAB, 0.3QFP, 0.5QFP) are mixedly mounted thereonto, the mounting reliability is measured to obtain results shown in Table 5. As seen from the results of this table, it has been confirmed that it is possible to conduct surface mounting within a wide range (rough pitch, fine pitch) in the mounting using the solder precoated conductor circuit substrate according to the invention.

Moreover, in case of the electrolytic solder plating in the comparative example in Table 5, it is required to use leads for the supply of current, so that there are problems that the decrease of wiring density is brought about and the productivity is very poor. Furthermore, in case of the electroless substitution solder plating, it is difficult to thicken the solder layer and it is necessary to supply the solder onto the Cu pad of rough pitch by any means and there is a problem that the productivity becomes very poor. Moreover, in case of the solder paste printed method, there is a problem that it is difficult to supply the solder onto the Cu pad of fine pitch (not more than 0.3 mm) with a high reliability.

In the method according to the invention, it is clear that there are not caused the aforementioned problems and the invention is a very useful technique.

TABLE 5

| | Kind of circuit substrate *1 | Solder supply method | Mounting reliability *2 | | | Thickness of solder *3 | Correspondence to fine pitch *4 | Electrolytic lead *5 |
|---|---|---|---|---|---|---|---|---|
| | | | 0.5 mm QFP | 0.3 mm QFP | 0.15 mm QFP | | | |
| Example | | | | | | | | |
| 1 | A | Method | o | o | o | o | o | o |
| 2 | A | according | o | o | o | o | o | o |
| 3 | A | to the | o | o | o | o | o | o |
| 4 | S | invention | o | o | o | o | o | o |
| Comparative Example | | | | | | | | |
| 1 | A | Solder paste | o | x | x | o | x | o |

TABLE 5-continued

| Kind of circuit substrate *1 | Solder supply method | Mounting reliability *2 | | | Thickness of solder *3 | Correspondence to fine pitch *4 | Electrolytic lead *5 |
|---|---|---|---|---|---|---|---|
| | | 0.5 mm QFP | 0.3 mm QFP | 0.15 mm QFP | | | |
| 2 | A | printing methd Electrolytic solder plating method | o | o | o | o | o | x |
| 3 | A | Electroless substitution solder plating method | x | x | o | x | o | o |
| 4 | S | Solder paste printing method | o | Δ | x | o | x | o |
| 5 | S | Electrolytic solder plating method | o | o | o | o | o | x |
| 6 | S | Electroless substitution solder plating method | x | x | o | x | o | o |

*1: A - Additive type printed conductor circuit substrate
S - Subtractive type printed conductor circuit substrate
*2: Mounting reliability
Mounting reliability when the solder supply method is restricted to one method and 0.5 mm QFP, 0.3 mm QFP and 0.15 mm TAB are mixedly mounted onto the same substrate, which is evaluated by a product yield after the mounting.
o; 100%   Δ; 98–100%   X; less than 98%
*3: Thickness of solder
It is evaluated whether or not the formation of solder having a thickness of not less than 50 μm is possible. o; possible   X; impossible
*4: Correspondence to fine pitch
It is evaluated whether or not the formation of solder having a pitch of not more than 0.3 mm is possible. o; possible   X; impossible
*5: Electrolytic lead
It is evaluated whether or not leads for the supply of current is possible. o; necessary   X: unnecessary

INDUSTRIAL APPLICABILITY

As mentioned above, the solder precoated conductor circuit substrates according to the invention have excellent properties as compared with the conventional surface mounting substrates and are possible to conduct the mounting at more fine pitch and are excellent in the productivity, so that they are used in not only the mounting at a pitch width of 0.3 mm but also in the mounting at narrower pitch in a high reliability.

Particularly, the solder precoated conductor circuit substrate using the additive substrate has a peculiar permanent resist, so that a self-alignment effect inherent to the permanent resist can be utilized. As a result, it is easy to conduct the positioning in the assembling of surface mounting component and it is possible to prevent solder bridge through a solder dam effect in the solder fellow after the mounting of the component.

We claim:

1. A solder-precoated conductor circuit substrate formed by previously disposing a solder layer required for mounting onto conductors for the connection of an electronic component, said solder layer comprising an Sn thin-film layer and a Pb-coated Sn layer in which at least a part of Sn crystal grains is coated with Pb film.

2. The solder-precoated conductor circuit substrate according to claim 1, wherein a metal layer formed by the Sn thin-film layer and the Pb-coated Sn layer, in which at least a part of Sn crystal grains is coated with Pb film, is melted by heating to form an alloy layer.

3. The solder-precoated conductor circuit substrate according to claim 1, wherein the Sn thin-film layer has a thickness of 0.1–2 μ m.

4. The solder-precoated conductor circuit substrate according to claim 1, wherein the Sn crystal grains in the Pb-coated Sn layer has an average particle size of 1–100 μm.

5. The solder-precoated conductor circuit substrate according to claim 1, wherein the Pb film in the Pb-coated Sn layer has a thickness of 0.1–5 μ m.

6. A method of producing a solder-precoated conductor circuit substrate formed by previously disposing a solder layer required for mounting onto conductors for the connection of an electronic component, comprising forming the solder layer by a process comprising:

(1) forming an Sn thin-film layer onto conductors of a conductor circuit substrate formed for the connection of the electronic component;

(2) selectively precipitating Sn on the Sn thin-film layer through Sn unhomogeneous reaction to form an Sn crystal layer; and (3) coating at least a part of Sn crystal grains in the Sn crystal layer with Pb film through Sn-Pb substitution reaction based on ionization tendency to form a Pb-coated Sn layer.

7. A method of producing a solder-precoated conductor circuit substrate formed by previously disposing a solder layer required for mounting onto conductors for the connection of an electronic component, comprising forming the solder layer by a process comprising:

(1) forming an Sn thin-film layer onto conductors of a conductor circuit substrate formed for the connection of the electronic component;

(2) selectively precipitating Sn on the Sn thin-film layer through Sn unhomogeneous reaction to form an Sn crystal layer; and (3) coating at least part of Sn crystal grains in the Sn crystal layer with Pb film through Sn-Pb substitution reaction based on ionization tendency to form a Pb-coated Sn layer; and (4) melting the Sn thin-film layer and the Pb-coated Sn layer in which at least a part of Sn crystal grains is coated with Pb film through heating and then cooling to form an alloy layer.

8. The method of producing a solder-precoated conductor circuit substrate according to claim 6, wherein the formation of Sn thin-film layer on the conductor for the connection of the electronic component comprises a Cu-Sn substitution reaction based on Cu complex formation from Cu and thiourea.

9. The method according to claim 8, wherein the Sn thin-film layer has a thickness of 0.1–2 μ m.

10. The method according to claim 6, wherein the Sn crystal grains in the Pb-coated Sn layer has an average particle size of 1–100 μ m.

11. The method according to claim 6, wherein a precipitation rate of the Sn crystal layer is 1–50 μ m/hr as a conversion into thickness after the melting.

12. The method according to claim 6, wherein the Sn-Pb substitution reaction based on ionization tendency is carried out at room temperature—90° C.

13. The method according to claim 6, wherein the Pb film in the Pb-coated Sn layer has a thickness of 0.1–5 μ m.

* * * * *